United States Patent
Takano et al.

(10) Patent No.: US 10,190,017 B2
(45) Date of Patent: Jan. 29, 2019

(54) PROTECTIVE FILM-FORMING FILM AND METHOD OF MANUFACTURING SEMICONDUCTOR CHIP WITH PROTECTIVE FILM

(71) Applicant: Lintec Corporation, Tokyo (JP)

(72) Inventors: Ken Takano, Kitaadachi-gun (JP); Naoya Saiki, Koshigaya (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 15/128,349

(22) PCT Filed: Mar. 17, 2015

(86) PCT No.: PCT/JP2015/057887
§ 371 (c)(1),
(2) Date: Sep. 22, 2016

(87) PCT Pub. No.: WO2015/146714
PCT Pub. Date: Oct. 1, 2015

(65) Prior Publication Data
US 2017/0121552 A1    May 4, 2017

(30) Foreign Application Priority Data

Mar. 28, 2014 (JP) .................. 2014-067468

(51) Int. Cl.
C09D 133/06 (2006.01)
C09J 11/06 (2006.01)
(Continued)

(52) U.S. Cl.
CPC .......... *C09D 133/068* (2013.01); *C09D 7/63* (2018.01); *C09J 11/06* (2013.01); *C09J 133/068* (2013.01);
(Continued)

(58) Field of Classification Search
None
See application file for complete search history.

(56) References Cited

U.S. PATENT DOCUMENTS 5,218,128 A    6/1993   Dean et al.
8,066,824 B2 * 11/2011  Breitenkamp .......... A61L 27/04
                                                148/240
(Continued)

FOREIGN PATENT DOCUMENTS

CN    101218089 A    7/2008
CN    104838491 A    8/2015
(Continued)

OTHER PUBLICATIONS

JP 2011228637—Machine English Translation.*
(Continued)

*Primary Examiner* — Jose R Diaz
(74) *Attorney, Agent, or Firm* — Christopher Casieri (57) ABSTRACT

A protective film-forming film is provided for forming a protective film which protects a metal film provided on a back surface of a semiconductor chip and is not likely to peel off from the metal film even after undergoing a history of temperature changes. This protective film-forming film is formed of a protective film-forming composition to which a coupling agent having a thiol group or a protected thiol group is added.

4 Claims, 1 Drawing Sheet (51) Int. Cl.
*C09J 133/06* (2006.01)
*C09D 7/63* (2018.01)
*H01L 21/02* (2006.01)
*H01L 21/78* (2006.01)
*H01L 23/29* (2006.01)
*H01L 23/31* (2006.01)
*C08K 5/548* (2006.01)

(52) U.S. Cl.
CPC ............ *H01L 21/022* (2013.01); *H01L 21/78* (2013.01); *H01L 23/295* (2013.01); *H01L 23/3157* (2013.01); *C08K 5/548* (2013.01)

(56) References Cited

U.S. PATENT DOCUMENTS

| | | | |
|---|---|---|---|
| 2002/0175326 A1 | 11/2002 | Reed et al. | |
| 2011/0221052 A1 | 9/2011 | Imanishi et al. | |
| 2013/0011998 A1 | 1/2013 | Shinoda et al. | |

FOREIGN PATENT DOCUMENTS

| | | | |
|---|---|---|---|
| JP | 59-013752 A | | 1/1984 |
| JP | 2000273287 A | * | 10/2000 |
| JP | 2002-100589 A | | 4/2002 |
| JP | 2002-280329 A | | 9/2002 |
| JP | 2008-248129 A | | 10/2008 |
| JP | 2009-256619 A | | 11/2009 |
| JP | 2009-283927 A | | 12/2009 |
| JP | 2010-053334 A | | 3/2010 |
| JP | 2010-070610 A | | 4/2010 |
| JP | 2011-009709 A | | 1/2011 |
| JP | 2011-115758 A | | 6/2011 |
| JP | 2011-216677 A | | 10/2011 |
| JP | 2011-228637 A | | 11/2011 |
| JP | 2013-194102 A | | 9/2013 |
| JP | 2014-022476 A | | 2/2014 |

OTHER PUBLICATIONS

International Search Report for international application No. PCT/JP2015/057887.
Office Action for Chinese Application No. 201580008941.2 dated Mar. 28, 2018.
Office Action for Japanese Application No. 2016-510267 dated Sep. 18, 2018.

* cited by examiner

PROTECTIVE FILM-FORMING FILM AND METHOD OF MANUFACTURING SEMICONDUCTOR CHIP WITH PROTECTIVE FILM

This application is a 371 of international application No. PCT/JP2015/057887, filed Mar. 17, 2015, which, in turn, claims priority of Japanese Patent Application No.: 2014-067468, filed on Mar. 28, 2014.

TECHNICAL FIELD

The present invention relates to a protective film-forming film and a method of manufacturing a semiconductor chip with a protective film using the protective film-forming film.

Priority is claimed on Japanese Patent Application No. 2014-67468, filed Mar. 28, 2014, the content of which is incorporated herein by reference.

BACKGROUND ART

In the related art, a semiconductor device is manufactured using a packaging method called a face-down method. In the face-down method, a front surface of a semiconductor chip where an electrode such as a bump is formed faces a substrate or the like and is joined to the substrate or the like. On the other hand, a back surface of the semiconductor chip is exposed and thus is protected by a protective film. On the protective film which protects the back surface of the semiconductor chip, a mark, a character, or the like is printed by, for example, laser printing or the like.

Until now, the protective film has been formed by, for example, resin coating. However, recently, for example, in order to secure uniformity in the thickness of a protective film, a technique of forming a protective film by protective film-forming film bonding has been put into practice (for example, refer to PTL 1). For example, this protective film-forming film is provided on a support sheet and includes: a thermosetting component that is formed of an epoxy resin or the like; and a binder resin component that is formed of an acrylic resin or the like.

Further, a protective film-forming film capable of realizing high reliability even under severe temperature conditions has been disclosed (refer to PTL 2). The protective film-forming film is provided on a release sheet (support sheet) and includes: a thermosetting epoxy resin; an acrylic polymer; and a resin in which a functional group, which is reactive with an epoxy group, and an unsaturated hydrocarbon group are present in one molecule.

CITATION LIST

Patent Literature

[PTL 1] Japanese Unexamined Patent Application, First Publication No. 2002-280329
[PTL 2] Japanese Unexamined Patent Application, First Publication No. 2008-248129

SUMMARY OF INVENTION

Technical Problem

On the other hand, as a target to which a protective film-forming film is bonded, a semiconductor material such as silicon on a back surface of a semiconductor chip has been mainly used. However, recently, along with a reduction in the thickness of a device, the thickness of a device including a metal film on a back surface thereof has been reduced. Therefore, it has been required to protect a metal film on a back surface of a semiconductor chip. However, a protective film-forming film in the related art has a problem in that, in a case where the protective film-forming film is bonded to a metal film, an adhesive force is not sufficient and, particularly, under high-temperature conditions, the protective film-forming film is likely to peel off from the metal film.

The present invention has been made in consideration of the above-described circumstances, and an object thereof is to provide a protective film-forming film for forming a protective film which protects a metal film provided on a back surface of a semiconductor chip and is not likely to peel off from the metal film even after undergoing a history of temperature changes.

Solution to Problem

According to the present invention for solving the above-described problems, a protective film-forming film is provided for forming a protective film which protects a metal film provided on a back surface of a semiconductor chip. The protective film-forming film is formed of a protective film-forming composition to which a coupling agent having a thiol group or a protected thiol group is added.

In the protective film-forming film according to the present invention, it is preferable that the coupling agent have a protected thiol group.

In the protective film-forming film according to the present invention, it is preferable that a ratio of an amount of an inorganic filler in the protective film-forming composition to a total amount of components of the protective film-forming composition other than a solvent be 55 mass % to 75 mass %.

In the protective film-forming film according to the present invention, it is preferable that the protective film-forming composition further include an acrylic resin having a glass transition temperature of −3° C. or higher.

In the protective film-forming film according to the present invention, it is preferable that the protective film-forming composition further include an acrylic resin, and that the acrylic resin be obtained by polymerization of monomers including 8 mass % or lower of glycidyl (meth)acrylate with respect to the total amount of monomers constituting the acrylic resin.

In addition, according to the present invention, a method is provided for manufacturing a semiconductor chip with a protective film in which a metal film provided on a back surface of the semiconductor chip is protected by the protective film, the method including: preparing a laminate in which the above-described protective film-forming film is laminated on a metal film provided on a back surface of a semiconductor wafer; and forming a protective film using the protective film-forming film of the laminate and then dicing the laminate, or dicing the laminate and then forming a protective film using the protective film-forming film.

Advantageous Effects of Invention

According to the present invention, a protective film-forming film is provided for forming a protective film which protects a metal film provided on a back surface of a semiconductor chip and is not likely to peel off from the metal film even after undergoing a history of temperature changes.

DESCRIPTION OF EMBODIMENTS

<Protective Film-Forming Film and Method of Manufacturing the Same>

A protective film-forming film according to the present invention is a film for forming a protective film which protects a metal film provided on a back surface of a semiconductor chip. This protective film-forming film is formed of a protective film-forming composition to which a coupling agent having a thiol group (—SH) or a protected thiol group (hereinafter, abbreviated as "coupling agent (E)") is added.

By bonding the protective film-forming film, which includes the coupling agent having a thiol group (—SH) or a protected thiol group, to a metal film and curing the protective film-forming film, a protective film can be formed, and the adhesive force of this protective film with the metal film is sufficiently improved. In addition, this protective film has a satisfactory initial adhesive force, is not likely to peel off from the metal film even after undergoing a history of temperature changes, and has high reliability.

[Coupling Agent (E)]

The coupling agent (E) includes at least one of a thiol group or a protected thiol group in one molecule and further includes a functional group which is reactive (can be coupled) with another molecule. For example, in a case where a filler described below is added to the protective film-forming composition, examples of "another molecule" described herein include molecules constituting the filler. "Protected thiol group" described in this specification refers to a protected group in which a hydrogen atom of a thiol group (—SH) is substituted with a group (protective group) other than a hydrogen atom.

Examples of the protective group in the protected thiol group (the group with which a hydrogen atom of a thiol group is substituted) include a trialkoxysilyl group, a trialkylsilyl group, a trialkylsiloxy group, a carbamate group, a carbonate group, and an acetyl group. The alkyl group constituting the protective group may be linear, branched, or cyclic and it is preferable that the alkyl group have 1 to 10 carbon atoms.

As the coupling agent (E), a well-known product can be used.

The total number of thiol groups and protected thiol groups present in one molecule of the coupling agent (E) is not particularly limited and is preferably 1 to 3 and more preferably 1 or 2.

It is preferable that the coupling agent (E) have a thiol group or a protected thiol group at a terminal of the molecule.

In addition, it is preferable that, in the coupling agent (E), the functional group which is reactive with another molecule be linked to the thiol group or the protected thiol group through a divalent organic group having two or more carbon atoms. In addition, the divalent organic group is preferably an alkylene group, more preferably an alkylene group having 3 or more carbon atoms, and still more preferably an alkylene group having 3 to 10 carbon atoms.

As a preferable example of the coupling agent (E), a compound represented by the following formula (1) can be used.

$$(R^1O)_3—Si—X^1—S—Y^1 \qquad (1)$$

(wherein $R^1$ represents an alkyl group in which three $R^1$s may be the same as or different from each other; $X^1$ represents an alkylene group; and $Y^1$ represents a hydrogen atom, a trialkoxysilyl group, a trialkylsilyl group, a trialkylsiloxy group, a carbamate group, or a carbonate group)

In formula (1), $R^1$ represents an alkyl group, and this alkyl group may be linear, branched, or cyclic. In a case where the alkyl group is cyclic, the alkyl group may be monocyclic or polycyclic.

The linear or branched alkyl group represented by $R^1$ is preferably an alkyl group having 1 to 10 carbon atoms, and examples of this alkyl group include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a n-hexyl group, a 2-methylpentyl group, a 3-methylpentyl group, a 2,2-dimethylbutyl group, a 2,3-dimethylbutyl group, a n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, a n-octyl group, an isooctyl group, a nonyl group, and a decyl group.

The cyclic alkyl group represented by $R^1$ is preferably an alkyl group having 3 to 10 carbon atoms, and examples of the alkyl group include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, an 1-adamantyl group, a 2-adamantyl group, and a tricyclodecyl group. Further, other examples of the cyclic alkyl group represented by $R^1$ include the above-described cyclic alkyl groups in which one or more hydrogen atoms are substituted with a linear, branched, or cyclic alkyl group. Examples of the linear, branched, or cyclic alkyl group with which one or more hydrogen atoms are substituted include the above-described examples of the alkyl groups represented by $R^1$.

In the compound represented by formula (1), each of three tetravalent Si atoms is bonded to ($R^1O$).

In addition, three $R^1$s may be the same as or different from each other. That is, all of the three $R^1$s may be the same as each other, all of the three $R^1$'s may be different from each other, or only two $R^1$s may be the same as each other.

In formula (1), $X^1$ represents an alkylene group, and the number of carbon atoms in the alkylene group is preferably 3 or more, and more preferably 3 to 10. For example, a divalent group, such as a propane-1,3-diyl group, obtained by excluding one hydrogen atom from the above-described alkyl group having 3 to 10 carbon atoms can be used.

In formula (1), $Y^1$ represents a hydrogen atom, a trialkoxysilyl group, a trialkylsilyl group, a trialkylsiloxy group, a carbamate group, or a carbonate group. The alkyl group constituting the trialkoxysilyl group, the trialkylsilyl group, the trialkylsiloxy group, the carbamate group, or the carbonate group may be linear, branched, or cyclic, and the number of carbon atoms in the alkyl group is preferably 1 to 10. Examples of the alkyl group include the above-described examples of the alkyl group represented by $R^1$.

Among these, it is preferable that $Y^1$ represent a hydrogen atom or a trialkoxysilyl group.

The coupling agent (E) having a protected thiol group has a small amount of an odor or no odor. From the viewpoint of easy handleability in practice, the coupling agent (E) having a protected thiol group is preferable rather than the coupling agent (E) having a thiol group. Examples of the coupling agent (E) having a protected thiol group include a silane coupling agent such as $(CH_3O)_3Si$—$C_3H_6$—S—Si$(OC_2H_5)_3$). In addition, examples of the coupling agent (E) having a thiol group include a silane coupling agent such as $(CH_3O)_3Si$—$C_3H_6$—SH).

A ratio of the amount of the coupling agent (E) to the total amount of components of the protective film-forming composition other than a solvent is preferably 0.01 mass % to 7 mass % and more preferably 0.1 mass % to 2 mass %. By adjusting the ratio of the amount of the coupling agent (E) to the lower limit value or higher, a higher effect of preventing the protective film from peeling off from the metal film is obtained even after undergoing a history of temperature changes. In addition, by adjusting the ratio of the amount of the coupling agent (E) to the upper limit value or lower, in a case where the protective film-forming film contacts a release film, the possibility that releasability varies due to a reaction between the coupling agent (E) and a release agent is reduced.

In the present invention, by using the coupling agent (E), the coupling agent (E), or an organic compound having a sulfur atom (organic sulfur compound) derived from the coupling agent (E) is present in the protective film which protects the metal film. It is presumed that, by the sulfur atom in the compound forming a bond with a metal atom in the metal film, the adhesive force with the metal film of the protective film is improved due to an interaction. As a result, the protective film has a satisfactory initial adhesive force with the metal film, and is not likely to peel off from the metal film even after undergoing a history of temperature changes.

[Binder Resin (A)]

Preferable examples of components of the protective film-forming composition other than the coupling agent (E) include a binder resin (A). For example, the binder resin (A) is a component which imparts a satisfactory initial adhesive force to the metal film of the protective film-forming film and imparts flexibility and film formability to the protective film and the protective film-forming film.

As the binder resin (A), one type may be used, or two or more types may be used in combination.

As the binder resin (A), a well-known rein may be used. For example, an acrylic resin, a phenoxy resin, a polyester resin, a urethane resin, an acrylic urethane resin, a silicone resin, or a rubber polymer is preferable, and an acrylic resin is more preferable. That is, it is preferable that the protective film-forming composition (protective film-forming film) include an acrylic resin.

It is preferable that monomers constituting the acrylic resin do not include an epoxy group-containing monomer or include 8 mass % or lower of an epoxy group-containing monomer with respect to the total amount of the monomers constituting the acrylic resin.

In a case where the monomers constituting the acrylic resin include an epoxy group-containing monomer, specifically, the monomers constituting the acrylic resin consist of a combination of: one or more epoxy group-containing monomers selected from the group consisting of epoxy group-containing (meth)acylates and non-acrylic epoxy group-containing monomers; and various (meth)acrylates not containing an epoxy group or non-acrylic monomers not containing an epoxy group. In a case where the epoxy group-containing monomers consist of only non-acrylic epoxy group-containing monomers, the monomers constituting the acrylic resin include various (meth)acrylates not containing an epoxy group.

In this specification, "(meth)acrylic acid" represents both acrylic acid and methacrylic acid.

In a case where the protective film-forming composition includes a thermosetting epoxy resin (B) described below, the monomers constituting the acrylic resin include 8 mass % or lower of an epoxy group-containing monomer with respect to the total amount of the monomers constituting the acrylic resin. As a result, compatibility between the acrylic resin and a cured product of the thermosetting epoxy resin (B) decreases, a phase-separated structure described below is likely to be formed, and the reliability of a semiconductor chip with a protective film described below is improved. From this point of view, it is preferable that the monomers constituting the acrylic resin include 6 mass % or lower of an epoxy group-containing monomer with respect to the total amount of the monomers constituting the acrylic resin.

Examples of the epoxy group-containing (meth)acylate include glycidyl (meth)acrylate, β-methylglycidyl (meth)acrylate, (3,4-epoxycyclohexyl)methyl (meth)acrylate, and 3-epoxycyclo-2-hydroxypropyl (meth)acrylate. Among these, glycidyl (meth)acrylate is preferable.

Examples of the non-acrylic epoxy group-containing monomer include glycidyl crotonate and allyl glycidyl ether.

Among these, epoxy group-containing (meth)acylate is preferable as the epoxy group-containing monomer.

Since the monomers constituting the acrylic resin includes the epoxy group-containing monomer, a decrease in the gloss value of the protective film which is accelerated along with the progress of phase separation is easily prevented, and the legibility of a printed portion formed by laser printing is easily improved. Accordingly, in a case where the present invention is applied to an application in which satisfactory character legibility is required, it is preferable that the monomers constituting the acrylic resin include an epoxy group-containing monomer. The content of the epoxy group-containing monomer with respect to the total amount of the monomers constituting the acrylic resin is preferably 0.1 mass % or higher, more preferably 1 mass % or higher, and still more preferably 3 mass % or higher. That is, the content of the epoxy group-containing monomer with respect to the total amount of the monomers constituting the acrylic resin is preferably 0.1 mass % to 8 mass %, more preferably 1 mass % to 6 mass %, and still more preferably 3 mass % to 5 mass %.

In a case where the monomers constituting the acrylic resin does not include an epoxy group-containing monomer, specifically, the monomers constituting the acrylic resin consist of an appropriate combination of: various (meth)acrylates not including an epoxy group, for example, hydroxyl group-containing (meth)acrylate or an alkyl ester (meth)acrylate; and non-acrylic monomers not containing an epoxy group, for example, styrene, ethylene, vinyl ether, or vinyl acetate.

It is preferable that the monomers constituting the acrylic resin include an alkyl ester (meth)acrylate. Due to not only an increase or a decrease in the number of carbon atoms in the alkyl ester (meth)acrylate but also the use of alkyl ester (meth)acrylates having different number of carbon atoms, the glass transition temperature (Tg) of the acrylic resin can be easily adjusted.

The content of the alkyl ester (meth)acrylate with respect to the total amount of the monomers constituting the acrylic resin is preferably 50 mass % or higher, and more preferably 70 mass % or higher. In addition, the content of the alkyl ester (meth)acrylate with respect to the total amount of the monomers constituting the acrylic resin is preferably 92 mass % or lower. That is, the content of the alkyl ester (meth)acrylate with respect to the total amount of the monomers constituting the acrylic resin is preferably 50 mass % to 92 mass %, and more preferably 70 mass % to 92 mass %.

Examples of the alkyl ester (meth)acrylate include alkyl ester (meth)acrylates which include an alkyl group having 1 to 18 carbon atoms, for example, methyl (meth)acrylate, ethyl (meth)acrylate, propyl (meth)acrylate, butyl (meth)acrylate, pentyl (meth)acrylate, 2-ethylhexyl (meth)acrylate, isooctyl (meth)acrylate, n-octyl (meth)acrylate, n-nonyl (meth)acrylate, isononyl (meth)acrylate, decyl (meth)acrylate, and lauryl (meth)acrylate.

In addition, the content of an alkyl ester (meth)acrylate, which includes an alkyl group having 4 or more carbon atoms among the alkyl ester (meth)acrylates, with respect to the total amount of the monomers constituting the acrylic resin is preferably 12 mass % or lower. With the above-described configuration, the gloss value of the protective film can be easily adjusted to a satisfactory value while maintaining the glass transition temperature of the acrylic resin at −3° C. or higher. This gloss value is an index indicating gloss or luster and can be measured using a method defined in JIS Z 8741.

In order to improve the gloss value of the protective film while maintaining the reliability of the protective film, the content of the alkyl ester (meth)acrylate which includes an alkyl group having 4 or more carbon atoms with respect to the total amount of the monomers constituting the acrylic resin is preferably 1 mass % to 12 mass %, and more preferably 5 mass % to 12 mass %.

As the alkyl ester (meth)acrylate which includes an alkyl group having 4 or more carbon atoms, butyl (meth)acrylate is preferable.

In addition, it is preferable that the monomers constituting the acrylic resin include an alkyl ester (meth)acrylate which includes an alkyl group having 3 or less carbon atoms among the alkyl ester (meth)acrylates. With the above-described configuration, as described below, the glass transition temperature of the acrylic resin can be easily adjusted to −3° C. or higher while maintaining the thermal stability and the like of the acrylic resin. From this point of view, the content of the alkyl ester (meth)acrylate which includes an alkyl group having 3 or less carbon atoms with respect to the total amount of the monomers constituting the acrylic resin is preferably 50 mass % or higher, and more preferably 60 mass % or higher.

The content of the alkyl ester (meth)acrylate which includes an alkyl group having 3 or less carbon atoms with respect to the total amount of the monomers constituting the acrylic resin is preferably 90 mass % or lower.

As the alkyl ester (meth)acrylate which includes an alkyl group having 3 or less carbon atoms, methyl (meth)acrylate or ethyl (meth)acrylate is preferable, and methyl (meth)acrylate is more preferable.

Further, the total amount of the monomers constituting the acrylic resin may consist of the amount of an alkyl ester (meth)acrylate which includes an alkyl group having 4 or more carbon atoms and the amount of an alkyl ester (meth)acrylate which includes an alkyl group having 3 or less carbon atoms, among the alkyl ester (meth)acrylates.

The monomers constituting the acrylic resin may include a hydroxyl group-containing (meth)acrylate. By adding the hydroxyl group-containing (meth)acrylate, the acrylic resin has a hydroxyl group, and thus the adhesiveness or adhesion properties of the protective film with a semiconductor chip can be easily adjusted.

Examples of the hydroxyl group-containing (meth)acrylate include hydroxymethyl (meth)acrylate, 2-hydroxyethyl (meth)acrylate, and 2-hydroxypropyl (meth)acrylate.

The content of the hydroxyl group-containing (meth) acrylate with respect to the total amount of the monomers constituting the acrylic resin is preferably 1 mass % to 30 mass %, more preferably 5 mass % to 25 mass %, and still more preferably 10 mass % to 20 mass %.

In order to more efficiently impart flexibility and film formability to the protective film-forming film, the weight-average molecular weight (Mw) of the acrylic resin is preferably 10000 or higher, more preferably 15000 to 1000000, and still more preferably 20000 to 500000.

Unless specified otherwise, in this specification, the weight-average molecular weight is a value in terms of polystyrene measured by gel permeation chromatography (GPC).

It is preferable that the glass transition temperature of the acrylic resin be −3° C. or higher. By adjusting the glass transition temperature to −3° C. or higher, the movability of the acrylic resin is sufficiently prevented, an effect of preventing deformation caused by the thermal history of the protective film is improved, and the reliability of a semiconductor chip with a protective film is further improved.

It is preferable that the glass transition temperature of the acrylic resin be 6° C. or lower. By adjusting the glass transition temperature of the acrylic resin to 6° C. or lower, the above-described gloss value of the protective film is improved, and the legibility of a printed portion of the protective film on which a mark or a character is printed is further improved. The reason for this is not clear but is presumed to be because, since the acrylic resin has appropriate movability, the surface shape of the protective film after curing is smoothened.

In this specification, unless specified otherwise, the glass transition temperature of the acrylic resin is a theoretical value obtained using Fox's formula.

The monomers constituting the acrylic resin do not include an epoxy group-containing monomer or include a small amount of an epoxy group-containing monomer. As a result, in the protective film, a phase which is rich in the acrylic resin and a phase which is rich in the cured product of the thermosetting epoxy resin (B) described below are easily separated from each other, and the reliability of a semiconductor chip with a protective film is improved. The reason for this is presumed to be because, even in a case where a semiconductor chip with a protective film undergoes a temperature change after packaging, stress which is generated by deformation caused by the temperature change is relaxed by the phase which is rich in the flexible acrylic resin; therefore, peeling of the protective film caused by stress is not likely to occur. In addition, in the phase-separated and thermally-cured protective film-forming film (that is, the protective film), it is preferable that the phase which is rich in the acrylic resin be a continuous phase. As a result, the above-described effect of improving the reliability is further improved.

The phase which is rich in the acrylic resin and the phase which is rich in the cured product of the thermosetting epoxy resin (B) can be distinguished from each other, for example, by specifying which material is a major component of a phase based on a measurement chart of the phase obtained by Raman scattering spectroscopy. In addition, in a case where the size of a phase-separated structure is less than the resolution of Raman spectroscopy, based on the hardness in a tapping mode measurement of a scanning probe microscope (SPM), it can be presumed that a phase having a higher hardness is a phase which is rich in the cured product of the thermosetting epoxy resin (B); and that a phase having a lower hardness is a phase which is rich in the acrylic resin. Therefore, in the present invention, the protective film obtained by curing the protective film-forming film is analyzed by Raman scattering spectroscopy or is observed with a SPM to determine whether or not a phase-separated structure is formed.

It is preferable that the determination of whether or not a phase-separated structure is formed in the protective film-forming film be performed by observing a protective film obtained by preparing a protective film-forming film using a protective film-forming composition which does not include a filler (F) and a colorant (G) described below, laminating the protective film-forming film on a silicon wafer, and thermally curing the laminate. The reason for this is that, in the protective film-forming film which includes the filler (F) and the colorant (G), it is difficult to determine whether or not a phase-separated structure is formed.

A ratio of the content of the acrylic resin to the total mass of the protective film-forming film in terms of solid content (a ratio of the amount of the acrylic resin to the total amount of components of the protective film-forming composition other than a solvent) is preferably 10 mass % to 80 mass % and more preferably 15 mass % to 50 mass %.

In the present invention, it is more preferable that the protective film-forming film (or the protective film-forming composition for forming the protective film-forming film) include an acrylic resin and that the glass transition temperature of the acrylic resin be −3° C. or higher.

In addition, it is still more preferable that the protective film-forming film (or the protective film-forming composition for forming the protective film-forming film) include an acrylic resin and that the acrylic resin be obtained by polymerization of monomers including 8 mass % or lower of glycidyl (meth)acrylate with respect to the total amount of monomers constituting the acrylic resin.

[Thermosetting Epoxy Resin (B)] and [Thermal Curing Agent (C)]

Other preferable examples of components of the protective film-forming composition other than the coupling agent (E) include a thermosetting epoxy resin (B) and a thermal curing agent (C). The thermosetting epoxy resin (B) is a component which hardens the protective film by curing. In addition, the thermal curing agent (C) functions as a curing agent for curing the thermosetting epoxy resin (B). In the present invention, the thermosetting epoxy resin (B) may be used without using the thermal curing agent (C). From the viewpoint of easily adjusting the curing rate and easily adjusting the physical properties of the protective film such as elastic modulus to preferable ranges, it is preferable that the thermosetting epoxy resin (B) and the thermal curing agent (C) be used in combination.

As each of the thermosetting epoxy resin (B) and the thermal curing agent (C), one type may be used singly, or two or more types may be used in combination.

As the thermosetting epoxy resin (B), a well-known product may be used. For example, a bifunctional or higher polyfunctional epoxy compound having two or more polymerizable groups in the molecules is preferable, and examples thereof include a biphenyl compound, bisphenol A diglycidyl ether, hydrogenated bisphenol A diglycidyl ether, an ortho-cresol novolac epoxy resin, a dicyclopentadiene epoxy resin, a biphenyl epoxy resin, a bisphenol A epoxy resin, a bisphenol F epoxy resin, and an epoxy resin having a phenylene skeleton.

As the thermal curing agent (C), a well-known product may be used. For example, a compound having two or more functional groups (structures) which are reactive with an epoxy group in one molecule is preferable. Examples of the functional groups which are reactive with an epoxy group include a phenolic hydroxyl group, an alcoholic hydroxyl group, an amino group, a carboxy group, and an acid anhydride group. Among these, a phenolic hydroxyl group, an amino group, or an acid anhydride group obtained by condensation of an acid group is preferable, and a phenolic hydroxyl group or an amino group is more preferable.

Examples of a phenolic curing agent having a phenolic hydroxyl group include a polyfunctional phenol resin, biphenol, a novolac phenol resin, a dicyclopentadiene phenol resin, a XYLOK phenol resin, and an aralkyl phenol resin.

Examples of an amide curing agent having an amino group include dicyandiamide.

The content of the thermal curing agent (C) in the protective film-forming film (the amount of the thermal curing agent (C) in the protective film-forming composition) with respect to 100 parts by mass of the thermosetting epoxy resin (B) is preferably 0.1 parts by mass to 100 parts by mass, more preferably 0.5 parts by mass to 50 parts by mass, and still more preferably 1 part by mass to 20 parts by mass.

By adjusting the content of the thermal curing agent (C) to the lower limit value or higher, the curing of the thermosetting epoxy resin (B) is likely to be sufficiently performed, and the adhesive force of the protective film with the metal film of the semiconductor chip is further improved. In addition, by adjusting the content of the thermal curing agent (C) to the upper limit value or lower, an increase in the moisture absorptivity of the protective film-forming film is prevented, and the reliability of a semiconductor chip with a protective film is improved.

The total content of the thermosetting epoxy resin (B) and the thermal curing agent (C) in the protective film-forming film (the total amount of the thermosetting epoxy resin (B) and the thermal curing agent (C) in the protective film-forming composition) with respect to 100 parts by mass of the binder resin (A) is preferably 200 parts by mass or lower, more preferably 150 parts by mass or lower, and still more preferably 100 parts by mass or lower.

In addition, the total content of the thermosetting epoxy resin (B) and the thermal curing agent (C) in the protective film-forming film (the total amount of the thermosetting epoxy resin (B) and the thermal curing agent (C) in the protective film-forming composition) with respect to 100 parts by mass of the binder resin (A) is preferably 20 parts by mass or higher, more preferably 40 parts by mass or higher, and still more preferably 60 parts by mass or higher.

That is, the total content of the thermosetting epoxy resin (B) and the thermal curing agent (C) in the protective film-forming film with respect to 100 parts by mass of the binder resin (A) is preferably 20 parts by mass to 200 parts by mass, more preferably 40 parts by mass to 150 parts by mass, and still more preferably 60 parts by mass to 100 parts by mass.

By adjusting the total content of the thermosetting epoxy resin (B) and the thermal curing agent (C) to the above-described range, the adhesive force of the protective film with the metal film of the semiconductor chip is further improved. In addition, the release force of the protective film from a support sheet described below is adjusted to a more appropriate range, and when the support sheet is released from the protective film, an effect of preventing release failure or the like is improved.

Further, by adjusting the total content of the thermosetting epoxy resin (B) and the thermal curing agent (C) to the upper limit value or lower, the above-described phase which is rich in the acrylic resin is likely to be a continuous phase, and the reliability of a semiconductor chip with a protective film is improved.

A ratio of the total content of the thermosetting epoxy resin (B) and the thermal curing agent (C) to the total mass of solid components of the protective film-forming film (a ratio of the total amount of the thermosetting epoxy resin (B) and the thermal curing agent (C) to the total amount of components of the protective film-forming composition other than a solvent) is preferably 5 mass % to 60 mass %, and more preferably 10 mass % to 40 mass %.

[Curing Accelerator (D)]

Other preferable examples of components of the protective film-forming composition other than the coupling agent (E) include a curing accelerator (D).

The curing accelerator (D) is a component which adjusts the curing rate of the protective film-forming film.

Preferable examples of the curing accelerator (D) include: tertiary amines such as triethylenediamine, benzyldimethylamine, triethanolamine, dimethylaminoethanol, or tris(dimethylaminomethyl)phenol; imidazoles (imidazoles in which one or more hydrogen atoms are substituted with a group other than a hydrogen atom) such as 2-methylimidazole, 2-phenylimidazole, 2-phenyl-4-methylimidazole, 2-phenyl-4,5-dihydroxymethylimidazole, or 2-phenyl-4-methyl-5-hydroxymethylimidazole; organic phosphines (phosphines in which one or more hydrogen atoms are substituted with an organic group) such as tributylphosphine, diphenylphosphine, or triphenylphosphine; and tetraphenylborates such as tetraphenylphosphonium tetraphenylborate or triphenylphosphine tetraphenylborate.

As the curing accelerator (D), one type may be used, or two or more types may be used in combination.

The content of the curing accelerator (D) in the protective film-forming film (the amount of the curing accelerator (D) in the protective film-forming composition) with respect to 100 parts by mass of the total amount of the thermosetting epoxy resin (B) and the thermal curing agent (C) is preferably 0.01 parts by mass to 10 parts by mass, and more preferably 0.1 parts by mass to 5 parts by mass.

By adjusting the content of the curing accelerator (D) to the above-described range, the protective film has satisfactory adhesion characteristics under high-temperature and high-humidity conditions, and a semiconductor chip with a protective film has high reliability even after being exposed to strict conditions.

[Filler (F)]

Other preferable examples of components of the protective film-forming composition other than the coupling agent (E) include a filler (F).

The filler (F) is a component which imparts moisture resistance, dimensional stability (elastic modulus), and the like to the protective film, and specific examples thereof include an inorganic filler. In addition, in a case where laser marking (a surface of the protective film is cut by laser light to print a character) is performed on the protective film, the filler (F) is exposed in the portion cut by laser light (printed portion), and the exposed filler (F) diffuses reflected light. Therefore, contrast between the printed portion and a non-printed portion increases, and the legibility of the printed portion is improved.

Preferable examples of the inorganic filler include: powders of silica, alumina, talc, calcium carbonate, titanium oxide, iron oxide, silicon carbide, boron nitride, and the like; beads obtained by spheroidizing the above-described powders; single crystal fibers of the above-described powders; and glass fibers. Among these, a silica filler or an alumina filler is particularly preferable.

The average particle size of the inorganic filler is, for example, preferably 0.005 µm to 20 µm, more preferably 0.01 µm to 15 µm, and still more preferably 0.1 µm to 12 µm. Here, the average particle size refers to an average outer diameter of one particle. In addition, from the viewpoint of improving the reliability of the protective film, it is preferable that the average particle size of the inorganic filler be as large as possible.

As the filler (F), one type may be used, or two or more types may be used in combination.

On the other hand, in a case where the content of the filler (F) in the protective film-forming film is high to some extent, the linear expansion coefficient of the protective film decreases, the shearing stress in an interface between the protective film and the metal film of the semiconductor chip increases, and the reliability (adhesion reliability) of a semiconductor chip with a protective film is improved. In addition, in a case where the content of the filler (F) in the protective film-forming film is low to some extent, the initial adhesive force of the protective film increases, and processability is improved.

From this point of view, in a case where the inorganic filler is used in the present invention, a ratio of the content of the filler (F) to the total mass of the protective film-forming film in terms of solid content (a ratio of the amount of the filler (F) to the total amount of components of the protective film-forming composition other than a solvent) is preferably 55 mass % to 75 mass %.

In addition, from the viewpoint of further improving the reliability of a semiconductor chip with a protective film after undergoing a history of temperature changes, a ratio of the content of the filler (F) to the total mass of the protective film-forming film in terms of solid content (a ratio of the amount of the filler (F) to the total amount of components of the protective film-forming composition other than a solvent) is preferably 50 mass % to 80 mass %, more preferably 55 mass % to 75 mass %, and still more preferably 60 mass % to 70 mass %.

[Colorant (G)]

Other preferable examples of components of the protective film-forming composition other than the coupling agent (E) include a colorant (G).

The colorant (G) may be used as a component which prevents malfunction of a semiconductor chip with a protective film by blocking infrared rays or the like generated from peripheral devices when the semiconductor chip is incorporated into an apparatus. In addition, the colorant (G) may be used as a component which improves the legibility of a character when a product number, a mark, or the like is printed on the protective film. That is, a product number may be printed on the protective film attached to the semiconductor chip using a laser marking method. In this case, in a case where the protective film includes the colorant (G), contrast between a printed portion and a non-printed portion increases, and the legibility of the printed portion is improved. In addition, the colorant (G) may be used as a component which contributes to the design by making a grinding mark of a semiconductor wafer difficult to recognize.

Examples of the colorant (G) include an organic pigment, an inorganic pigment, an organic dye, and an inorganic dye.

The dye is not particularly limited and may be any dye such as an acid dye, a reactive dye, a direct dye, a disperse dye, or a cationic dye. The pigment is not particularly limited, and a well-known pigment can be used.

Among these, a black pigment can be preferably used as the colorant (G) from the viewpoints of realizing satisfactory properties to block electromagnetic waves and infrared rays and further improving the legibility of a printed portion formed using a laser marking method.

Examples of the black pigment include carbon black, iron oxide, manganese dioxide, aniline black, and activated carbon. However, the black pigment is not limited to the examples. From the viewpoint of improving the reliability of a semiconductor chip with a protective film, it is more preferable that the black pigment be carbon black.

As the colorant (G), one type may be used, or two or more types may be used in combination.

A ratio of the content of the colorant (G) to the total mass of the protective film-forming film in terms of solid content (a ratio of the amount of the colorant (G) to the total amount of components of the protective film-forming composition other than a solvent) is preferably 0.01 mass % to 25 mass % and more preferably 0.03 mass % to 15 mass %.

[Other Additives]

In addition to the coupling agent (E), the binder resin (A), the thermosetting epoxy resin (B), the thermal curing agent (C), the curing accelerator (D), the filler (F), and the colorant (G), the protective film-forming composition may further include other additives within a range where the effects of the present invention do not deteriorate.

Examples of the other additives include a cross-linking agent, a compatibilizer, a leveling agent, a plasticizer, an antistatic agent, an antioxidant, an ion trapping agent, a gettering agent, a chain transfer agent, an energy ray-polymerizable compound, and a photopolymerization initiator. For example, in a case where a compatibilizer is used in the protective film-forming film, the compatibility between the phase which is rich in the acrylic resin (binder resin (A)) and the phase which is rich in the cured product of the thermosetting epoxy resin (B) can be appropriately adjusted, and an appropriate phase-separated structure can be designed.

It is preferable that the gloss value of at least one surface of the protective film formed by curing the protective film-forming film be 20 or higher when measured according to JIS Z 8741. In this case, when a surface of the protective film-forming film opposite to the surface having a gloss value of 20 or higher due to curing is attached to a semiconductor wafer and cured, the gloss value of a printed surface of the protective film formed by laser marking is 20 or higher. Therefore, a laser-printed surface is smoothened, contrast between the printed portion and the non-printed portion is improved, and the legibility of the printed portion is improved.

From the viewpoints of further improving the contrast between the printed portion and the non-printed portion and further improving the legibility of the printed portion, the gloss value is more preferably 27 or higher.

On the other hand, the upper limit value of the gloss value is not particularly limited and is preferably 45.

The gloss value can be appropriately adjusted, for example, using the following methods: an adjustment of the amount of monomers constituting the acrylic resin (binder resin (A)), for example, the epoxy group-containing monomer or the alkyl ester (meth)acrylate which includes an alkyl group having 4 or more carbon atoms; an adjustment of the type or content of the filler (F) in the protective film-forming film (protective film); or an adjustment of the type or content of the other additives in the protective film-forming film (protective film).

[Solvent]

It is preferable that the protective film-forming composition further include a solvent for dilution in addition to the above-described components.

The solvent is not particularly limited and preferable examples thereof include: hydrocarbons such as toluene or xylene; alcohols such as methanol, ethanol, 2-propanol, isobutyl alcohol (2-methylpropan-1-ol), or 1-butanol; esters such as ethyl acetate; ketones such as acetone or methyl ethyl ketone; ethers such as tetrahydrofuran; and amides (compounds having an amide bond) such as dimethylformamide or N-methylpyrrolidone.

As the solvent, one type may be used, or two or more types may be used in combination.

A ratio of the amount of the solvent to the total amount of all the components of the protective film-forming composition is preferably 25 mass % to 75 mass % and more preferably 35 mass % to 65 mass %.

The thickness of the protective film-forming film is not particularly limited and is preferably 3 μm to 200 μm, more preferably 5 μm to 150 μm, and still more preferably 7 μm to 80 μm. The thickness of the protective film-forming film can be measured using a measurement device and a measurement method generally known in the related art.

The protective film-forming film according to the present invention is typically provided so as to be removable from the support sheet and is used as a protective film-forming composite sheet as a laminate.

A surface of the protective film-forming film facing the support sheet has the same shape and size as those of a surface of the support sheet facing the protective film-forming film, or has a smaller size than that of the surface of the support sheet facing the protective film-forming film. In addition, a surface of the protective film-forming film facing a semiconductor wafer has substantially the same shape and size as those of a surface of the semiconductor wafer facing the protective film-forming film, or has a shape and a size where the entire surface of the semiconductor wafer facing the protective film-forming film can be covered.

Figure 1:
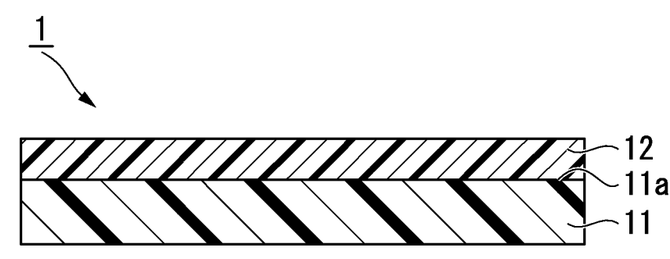
FIG. 1 is a cross-sectional view schematically showing a protective film-forming composite sheet including a protective film-forming film according to the present invention.

FIG. 1 is a cross-sectional view schematically showing a protective film-forming composite sheet including the protective film-forming film according to the present invention.

A protective film-forming composite sheet 1 described below is a laminate in which a protective film-forming film 12 is laminated on a surface 11a of a support sheet 11. A surface of the protective film-forming film 12 facing the support sheet 11 has the same shape and size as those of a surface (the surface 11a) of the support sheet 11 facing the protective film-forming film 12. However, as described above, the protective film-forming composite sheet 1 described herein is merely an embodiment in which the protective film-forming film according to the present invention is used. However, the present invention is not limited to the protective film-forming composite sheet.

Examples of a material of the support sheet include polyethylene, polypropylene, polybutene, polybutadiene, polymethylpentene, polyvinyl chloride, a vinyl chloride copolymer, polyethylene terephthalate, polyethylene naphthalate, polybutylene terephthalate, polyurethane, an ethylene-vinyl acetate copolymer, an ionomer resin, an ethylene-(meth)acrylic acid copolymer, an ethylene-(meth)acrylate copolymer, polystyrene, polycarbonate, polyimide, a fluororesin, and cross-linking products thereof.

In addition, the support sheet may be a color film.

The thickness of the support sheet is preferably 5 μm to 200 μm and more preferably 10 μm to 160 μm. The thickness of the support sheet can be measured using a measurement device and a measurement method generally used in the related art.

The support sheet may have a single-layer structure or a multi-layer structure including two or more layers. In a case where the support sheet has a multi-layer structure, these multiple layers may be the same as or different from each other. That is, all the layers may be the same as each other, all the layers may be different from each other, or only some of the layers may be different from each other. In a case where the multiple layers are different from each other, a combination of the multiple layers is not particularly limited. Here, multiple layers being different from each other means that at least either the materials or the thicknesses of the layers may be different from each other.

In a case where the support sheet has a multi-layer structure, it is preferable that the total thickness of the layers be the same as the thickness of the support sheet.

It is preferable that a release treatment be appropriately performed on the surface of the support sheet facing the protective film-forming film (the surface 11a of the support sheet 11 in FIG. 1). The release treatment can be performed using a well-known method, and examples of a release agent used in the release treatment include various release agents such as an alkyd release agent, a silicone release agent, a fluorine release agent, an unsaturated polyester release agent, a polyolefin release agent, or a wax release agent. From the viewpoint of realizing heat resistance, an alkyd release agent, a silicone release agent, or a fluorine release agent is preferable.

In addition, an adhesive sheet in which an adhesive layer is formed on a release film may be used as the support sheet. In this case the protective film-forming film is laminated on the adhesive layer provided on the support sheet. With the above-described configuration, in a case where a wafer is diced into chips for each protective film-forming film or each protective film, the fixing performance of the wafer or the chips, in particular, on the protective film-forming composite sheet is satisfactory, which is preferable. In addition, by using a removable adhesive layer as the adhesive layer, the protective film-forming film or the protective film is easily separated from the support sheet, which is preferable. As the removable adhesive layer, an adhesive layer having a low adhesion force where the protective film-forming film can be easily released may be used, or an energy ray-curable adhesive layer whose adhesion force decreases when irradiated with energy rays may be used. Specifically, the removable adhesive layer may be formed of various well-known adhesives of the related art (for example, common adhesives such as a rubber adhesive, an acrylic adhesive, a silicone adhesive, a urethane adhesive, or a vinyl ether adhesive; an adhesive having a rough surface; an energy ray-curable adhesive; or a thermally expandable component-containing adhesive).

The protective film-forming film may be protected by bonding a release film having low releasability to a surface of the protective film-forming film opposite the surface facing the support sheet.

The protective film-forming composition is obtained by appropriately mixing the coupling agent (E) with one or more selected from the binder resin (A), the thermosetting epoxy resin (B), the thermal curing agent (C), the curing accelerator (D), the filler (F), the colorant (G), the other additives, and the solvent such that the total amount of the components is 100%. For example, the above-described components are mixed with each other in appropriate amounts and stirred, and methyl ethyl ketone or the like is mixed with the obtained mixture for dilution while maintaining the temperature of the mixture at about 25° C. As a result, the protective film-forming composition was prepared.

During the mixing of the components, the order of adding the components was not particularly limited. For example, two or more components may be simultaneously added.

During the mixing, a method of mixing the components with each other was not particularly limited and could be appropriately selected from the following well-known methods: a method of mixing the components by rotating the components using a stirring bar, stirring blade, or the like; a method of mixing the components using a mixer; and a method of mixing the components by applying ultrasonic waves thereto.

The temperature and the time during the addition and mixing of the components can be appropriately adjusted without any particular limitation as long as the components do not deteriorate. For example, the temperature is preferably 15° C. to 30° C.

The protective film-forming film (or the protective film-forming composite sheet) according to the present invention can be manufactured, for example, by applying the protective film-forming composition to the surface of the support sheet (the surface 11a of the support sheet 11 in FIG. 1) and drying the protective film-forming composition. In addition, the protective film-forming film (or the protective film-forming composite sheet) according to the present invention can also be manufactured by applying the protective film-forming composition to a surface of a process film which is different from the support sheet, drying the protective film-forming composition to form a protective film-forming film, bonding the protective film-forming film to the surface of the support sheet, and then removing the process film. As in the case of the support sheet, a release treatment may be appropriately performed on the surface of the process film on which the protective film-forming film is formed. In addition, after bonding the protective film-forming film to the surface of the support sheet, the process film may be used as the release film without being removed.

Drying conditions of the protective film-forming composition are not particularly limited and may be selected according to the types of the components. For example, it is preferable that the components be mixed with each other at 60° C. to 120° C. for 1 minute to 30 minutes.

The protective film-forming composition may be applied to the surface of the support sheet or the surface of the process film using a well-known method, and examples of such well-known methods include those using various coaters such as an air knife coater, a blade coater, a bar coater, a gravure coater, a roll coater, a roll knife coater, a curtain coater, a die coater, a knife coater, a screen coater, a Meyer bar coater, or a kiss coater.

<Semiconductor Chip with Protective Film and Method of Manufacturing the Same>

The protective film-forming film according to the present invention can be used to manufacture a semiconductor chip with a protective film in which a metal film provided on a back surface of the semiconductor chip is protected by the protective film. Specifically, the semiconductor chip with a protective film can be manufactured using a method including: preparing a laminate in which the above-described protective film-forming film is laminated on a metal film provided on a back surface of a semiconductor wafer; and forming a protective film using the protective film-forming film of the laminate and then dicing the laminate, or dicing the laminate and then forming a protective film using the protective film-forming film. The details are as follows.

First, a semiconductor wafer is bonded to the protective film-forming composite sheet by bonding the protective film-forming film of the protective film-forming composite sheet to a metal film provided on a back surface of the semiconductor wafer. In a case where the protective film-forming film is protected by a release film, after the release film is removed to expose the protective film-forming film, the exposed protective film-forming film may be bonded to the metal film. As a result, the laminate including the support sheet is obtained.

A metal of the metal film to which the protective film-forming film is bonded is not particularly limited and is preferably gold, silver, or copper and more preferably gold or silver.

The metal film may have a single-layer structure or a multi-layer structure including two or more layers. In a case where the metal film has a multi-layer structure, these multiple layers may be the same as or different from each other.

Typically, it is preferable that the thickness of the metal film to which the protective film-forming film is bonded (in a case where the metal film has a multi-layer structure, a layer of the metal film to which the protective film-forming film is bonded) be 50 nm to 300 nm.

In the present invention, the semiconductor wafer may be, for example, a silicon wafer or a semiconductor wafer formed of a gallium compound, an arsenic compound, or the like. In a typical semiconductor wafer, a circuit is formed on a front surface, and a back surface opposite to the front surface is appropriately treated by grinding or the like such that the thickness thereof is about 50 μm to 500 μm.

Next, the support sheet is released from the protective film-forming film, and the protective film-forming film which is bonded to the metal film of the semiconductor wafer is cured by thermal curing or the like. As a result, a protective film is formed on the entire surface of the metal film. For example, using a commercially available tape mounter, the protective film-forming film is bonded to the surface of the metal film while heating the protective film-forming film to about 70° C. Further, after removing the release film, the protective film-forming film is cured by being heated at 130° C. for about 2 hours. As a result, the protective film is formed.

Next, the semiconductor wafer including the protective film (semiconductor wafer with a protective film) is diced for each circuit formed on the wafer surface. The dicing is performed by cutting the semiconductor wafer and the protective film together. Due to the dicing, the semiconductor wafer with a protective film is divided into plural semiconductor chips with a protective film. The dicing can be performed, for example, using a method including: bonding a dicing tape to a surface of the protective film; and dicing the silicon wafer, to which the protective film is bonded, into semiconductor chips having an appropriate size using a commercially available dicing machine.

Next, the obtained semiconductor chip is picked up using common means such as a collet. As a result, a semiconductor chip in which a back surface of the metal film is protected by the protective film (a semiconductor chip with a protective film) is obtained.

The support sheet may be removed not before the curing of the protective film-forming film but after the curing of the protective film-forming film (after the formation of the protective film), or may be removed after dicing. In a case where the support sheet is removed after the dicing, the support sheet also functions as a dicing sheet.

In addition, the protective film-forming film may be cured not before but after the dicing.

In the semiconductor chip with a protective film in which the metal film provided on the back surface of the semiconductor chip is protected by the protective film which is formed using the protective film-forming film according to the present invention, the adhesive force of the protective film with the metal film is sufficiently high. In addition, the protective film has a satisfactory initial adhesive force with the metal film, is not likely to peel off from the metal film even after undergoing a history of temperature changes, and thus has high reliability.

Regarding the above-described reliability, the reliability is high in a case where, when a thermal history is applied to 25 test samples of a semiconductor chip with a protective film, the number of test samples in which a joint portion between the semiconductor chip and the protective film floats or peels off and test samples in which the protective film cracks is 0 to 3.

In addition, examples of evaluation items of the protective film-forming film include odor. Odor can be evaluated, for example, by cutting the protective film-forming film into a specimen having a size of 20 cm×20 cm and performing a sensory test in which it is determined whether or not an odor is noticeable when the release film is released from the specimen under a temperature condition of 25° C.

EXAMPLES

Hereinafter, the present invention will be described in more detail using specific Examples. However, the present invention is not limited to the following Examples.
<Preparation of Protective Film-Forming Film (Protective Film-Forming Composite Sheet)>

Example 1

The following components having amounts shown in Table 1 below were mixed and stirred, and 700 parts by mass of methyl ethyl ketone was mixed with the mixture for dilution. As a result, a protective film-forming composition was prepared. During the mixing, the temperature of the mixture was adjusted to 25° C.
[Binder Resin (A)]
(1) Acrylic resin (A-1): a copolymer having a weight-average molecular weight of 350000 and a glass transition temperature of −1° C. which was obtained by copolymerization of butyl acrylate (10 parts by mass), methyl acrylate (70 parts by mass), glycidyl methacrylate (5 parts by mass), and 2-hydroxyethyl acrylate (15 parts by mass)
(2) Acrylic resin (A-2): a copolymer having a weight-average molecular weight of 350000 and a glass transition temperature of −4° C. which was obtained by copolymerization of butyl acrylate (15 parts by mass), methyl acrylate (65 parts by mass), glycidyl methacrylate (5 parts by mass), and 2-hydroxyethyl acrylate (15 parts by mass)
[Thermosetting Epoxy Resin (B)]
(1) Thermosetting epoxy resin (B-1): a bisphenol A epoxy resin (epoxy equivalent weight: 220 g/mol to 240 g/mol)
(2) Thermosetting epoxy resin (B-2): a dicyclopentadiene epoxy resin ("EPICLON HP-7200HH" (epoxy equivalent weight: 274 g/mol to 286 g/mol, manufactured by DIC Corporation))

[Thermal Curing Agent (C)]

(1) Thermal curing agent (C-1): dicyandiamide ("ADEKA HARDENER 3636AS", manufactured by ADEKA Corporation)

[Curing Accelerator (D)]

(1) Curing accelerator (D-1): 2-phenyl-4,5-dihydroxymethylimidazole ("CUREZOL 2PHZ", manufactured by Shikoku Chemicals Corporation)

[Coupling Agent (E) Having Thiol Group or Protected Thiol Group]

(1) Coupling agent (E-1): a silane coupling agent having a protected thiol group ("X-12-1056ES" $(CH_3O)_3Si$—$C_3H_6$—S—$Si(OC_2H_5)_3$, manufactured by Shin-Etsu Chemical Co., Ltd.)

(2) Coupling agent (E-2): a silane coupling agent having a thiol group ("KBM-803" $(CH_3O)_3Si$—$C_3H_6$—SH, manufactured by Shin-Etsu Chemical Co., Ltd.)

[Filler (F)]

(1) Inorganic filler (F-1): a fused silica filler (average particle size: 10 μm)

[Colorant (G)]

(1) Colorant (G-1): carbon black ("MA600" manufactured by Mitsubishi Chemical Corporation, average particle size: 20 nm)

[Coupling Agent (H) not Having Thiol Group or Protected Thiol Group]

(1) Coupling agent (H-1): an oligomer type silane coupling agent not having a thiol group or a protected thiol group ("X-41-1056" manufactured by Shin-Etsu Chemical Co., Ltd.)

(2) Coupling agent (H-2): a monomer type silane coupling agent not having a thiol group or a protected thiol group ("KBM-403" manufactured by Shin-Etsu Chemical Co., Ltd.)

Next, the protective film-forming composition obtained as described above was applied to a release-treated surface of a polyethylene terephthalate (PET) film with a single release-treated surface ("SP-PET 3811" manufactured by Lintec Corporation) such that the thickness of the applied protective film-forming composition after drying (the thickness of a protective film-forming film) was 25 μm, and was dried at 100° C. for 3 minutes. As a result, a protective film-forming film was formed (the protective film-forming composite sheet was formed) on the PET film. Further, a release film was bonded to the protective film-forming film.

<Manufacturing of Semiconductor Chip with Protective Film>

Titanium, nickel, and gold were vapor-deposited to form metal films on a #2000 polished surface of a silicon wafer (diameter: 200 mm, thickness: 200 μm) in this order such that the thickness of each metal film was 100 nm. The release film was released from the protective film-forming composite sheet obtained as described above. Next, using a tape mounter ("ADWILL RAD-3600 F/12", manufactured by Lintec Corporation), the protective film-forming film was bonded to a surface of the metal film while heating the protective film-forming film to 70° C. Next, the other release film (PET film) was removed, and the protective film-forming film was heated at 130° C. for 2 hours. As a result, the protective film-forming film was cured, and a protective film was formed on a surface of the metal film on a back surface side of the silicon wafer.

Next, a dicing tape ("ADWILL D-686H", manufactured by Lintec Corporation) was bonded to a surface of the protective film, and then the silicon wafer to which the protective film was bonded was diced into semiconductor chips having a size of 3 mm×3 mm using a dicing machine ("DFD651", manufactured by DISCO Corporation). As a result, semiconductor chips with a protective film were obtained.

<Evaluation of Semiconductor Chip with Protective Film>

(Evaluation of Reliability)

The semiconductor chips with a protective film obtained in the above-described procedure were treated under conditions simulating a process of actually mounting the semiconductor chip (preconditions). That is, first, in a thermostat, the semiconductor chips with a protective film were baked at 125° C. for 24 hours. Further, in a thermo-hygrostat, the semiconductor chips with a protective film were left to stand under a condition of temperature: 85° C. and relative humidity: 85% for 168 hours so as to be humidified. Immediately after being extracted from the thermo-hygrostat, the semiconductor chips with a protective film were passed through an IR reflow oven three times under conditions of: pre-heating temperature: 160° C., heating temperature: 260° C., and heating time: 30 seconds. 25 semiconductor chips with a protective film treated under the preconditions were installed in a cold impact tester ("TSE-11-A", manufactured by ESPEC Corp.) and were kept at −65° C. for 10 minutes and then kept at 150° C. for 10 minutes. This cycle was repeated 1000 times.

Next, in a reflection measurement method at a frequency of 140 MHz in which an ultrasonic scanning test device ("Hi-focus ST 120", manufactured by Hitachi Construction Machinery Co., Ltd.) was used, whether or not a joint portion between the semiconductor chip and the protective film floated or peeled off and whether or not the protective film cracked were determined using 25 semiconductor chips with a protective film extracted from the cold impact tester. A case in which the number of semiconductor chips with a protective film where at least one of floating, peeling, and cracking occurred was 0 was evaluated as "a", a case in which the number of semiconductor chips with a protective film where at least one of floating, peeling, and cracking occurred was 1 to 3 was evaluated as "b", and a case in which the number of semiconductor chips with a protective film where at least one of floating, peeling, and cracking occurred was 4 or more was evaluated as "c". The results are shown in Table 1 below.

<Evaluation of Protective Film-Forming Film>

(Evaluation of Odor)

The protective film-forming film obtained in the above-described procedure was cut into a specimen having a size of 20 cm×20 cm. The release film was released from the obtained specimen under a temperature condition of 25° C. Whether or not an odor was noticed was determined in a sensory test. A case where an odor was not noticed was evaluated as "a", and a case where an odor was noticed was evaluated as "c". The results are shown in Table 1 below.

<Preparation and Evaluation of Protective Film-Forming Film and Semiconductor Chip with Protective Film>

Examples 2 to 5, Comparative Examples 1 and 2

Protective film-forming films and semiconductor chips with a protective film were manufactured and evaluated using the same method as in Example 1, except that the types and amounts of components used during the preparation of the protective film-forming compositions were as shown in Table 1 below. The results are shown in Table 1 below.

TABLE 1

|  |  |  | Examples | | | | | Comparative Examples | |
|---|---|---|---|---|---|---|---|---|---|
|  |  |  | 1 | 2 | 3 | 4 | 5 | 1 | 2 |
| Components of Protective Film-Forming Film (Part(s) by Mass) | Binder Resin (A) | (A-1) | 150 | — | 150 | 150 | 150 | 150 | 150 |
|  |  | (A-2) | — | 150 | — | — | — | — | — |
|  | Thermosetting Epoxy Resin (B) | (B-1) | 70 | 70 | 70 | 70 | 70 | 70 | 70 |
|  |  | (B-2) | 30 | 30 | 30 | 30 | 30 | 30 | 30 |
|  | Thermal Curing Agent (C) | (C-1) | 2.4 | 2.4 | 2.4 | 2.4 | 2.4 | 2.4 | 2.4 |
|  | Curing Accelerator (D) | (D-1) | 2.4 | 2.4 | 2.4 | 2.4 | 2.4 | 2.4 | 2.4 |
|  | Coupling Agent (E) | (E-1) | 6 | 6 | 6 | 6 | — | — | — |
|  |  | (E-2) | — | — | — | — | 6 | — | — |
|  | Coupling Agent (H) | (H-1) | — | — | — | — | — | 6 | — |
|  |  | (H-2) | — | — | — | — | — | — | 6 |
|  | Filler (F) | (F-1) | 480 | 480 | 320 | 700 | 480 | 320 | 320 |
|  | Colorant (G) | (G-1) | 10 | 10 | 10 | 10 | 10 | 10 | 10 |
| Evaluation Results | Reliability |  | a | b | b | a | a | c | c |
|  | Odor |  | a | a | a | a | c | a | a |

As can be seen from the above results, in the semiconductor chips with a protective film according to Examples 1 to 5 in which the coupling agent (E) having a thiol group or a protected thiol group was used, the floating and peeling of the joint portion between the semiconductor chip and the protective film and cracking of the protective film were prevented, and the reliability was high after a history of temperature changes. In particular, the reliability of the semiconductor chips with a protective film according to Examples 1, 4, and 5 was high. The reason the reliability of Example 2 was lower than that of Examples 1, 4 and 5 after undergoing a history of temperature changes is presumed to be because the acrylic resin (A-2) having a glass transition temperature of lower than −3° C. was used as the binder resin (A). The reason the reliability of Example 3 was lower than that of Examples 1, 4 and 5 after undergoing a history of temperature changes is presumed to be because the ratio of the amount of the filler (F) to the total amount of components of the protective film-forming composition other than a solvent was lower than 55 mass %. On the other hand, in the protective film-forming films according to Examples 1 to 4 in which the coupling agent (E-1) having a protected thiol group was used, the occurrence of an odor was prevented.

On the other hand, in the semiconductor chips with a protective film according to Comparative Examples 1 and 2 in which the coupling agent (H) not having a thiol group or a protected thiol group was used, the floating and peeling of the joint portion between the semiconductor chip and the protective film or the cracking of the protective film was found, and the reliability was low after undergoing a history of temperature changes.

INDUSTRIAL APPLICABILITY

The present invention can be used to protect a metal film on a back surface or the like of a semiconductor chip.

REFERENCE SIGNS LIST

1: PROTECTIVE FILM-FORMING COMPOSITE SHEET
11: SUPPORT SHEET
11a: FRONT SURFACE OF SUPPORT SHEET
12: PROTECTIVE FILM-FORMING FILM

The invention claimed is:

1. A protective film-forming film for forming a protective film which protects a metal film provided on a back surface of a semiconductor chip,
   wherein the protective film-forming film is formed of a protective film-forming composition to which a coupling agent having a protected thiol group is added, and
   wherein the protective group in the protected thiol group includes at least one of the group consisting of a trialkoxysilyl group, a trialkylsilyl group, a trialkylsiloxy group, a carbamate group, a carbonate group, and an acetyl group, and
   wherein the coupling agent has a protected thiol group at a terminal of the molecule,
   wherein the coupling agent is composed of a compound represented by the following formula (1), and
   wherein the protective film-forming composition includes an acrylic resin having a glass transition temperature of −3 to 6 ° C., and (R¹O)₃—Si—X¹—S—Y¹                formula (1)

wherein R¹ represents an alkyl group in which three R¹'s may be the same as or different from each other; X¹ represents an alkylene group; and Y¹ represents the protective group in the protected thiol group.

2. The protective film-forming film according to claim 1,
   wherein a ratio of an amount of an inorganic filler in the protective film-forming composition to a total amount of components of the protective film-forming composition other than a solvent is 55 mass % to 75 mass %.

3. The protective film-forming film according to claim 1,
   wherein the protective film-forming composition includes an acrylic resin, and
   the acrylic resin is obtained by polymerization of monomers including 8 mass % or lower of glycidyl (meth) acrylate with respect to the total amount of monomers constituting the acrylic resin.

4. A method of manufacturing a semiconductor chip with a protective film in which a metal film provided on a back surface of the semiconductor chip is protected by the protective film, the method comprising:

preparing a laminate in which the protective film-forming film according to claim 1 is laminated on a metal film provided on a back surface of a semiconductor wafer; and forming a protective film using the protective film-forming film of the laminate and then dicing the laminate, or dicing the laminate and then forming a protective film using the protective film-forming film.

\* \* \* \* \*